United States Patent [19]

Storimans

[11] 4,361,173
[45] Nov. 30, 1982

[54] MACHINE FOR FORMING THE LEADS OF ELECTRONIC COMPONENTS

[76] Inventor: Franciscus J. A. Storimans, R.R. #4, Stouffville, Ontario, Canada

[21] Appl. No.: 122,417

[22] Filed: Feb. 19, 1980

[30] Foreign Application Priority Data

Feb. 14, 1980 [CA] Canada ................................. 345634

[51] Int. Cl.³ ..................... B21F 45/00; H05K 13/02
[52] U.S. Cl. ........................................ 140/1; 72/338; 140/105; 198/480
[58] Field of Search ..................... 140/105, 1; 29/739, 29/741, 564.6; 198/480, 654, 655; 72/338

[56] References Cited

U.S. PATENT DOCUMENTS

| | | | |
|---|---|---|---|
| 2,988,199 | 6/1961 | Pinkham | 198/654 X |
| 3,171,535 | 3/1965 | Harris | 198/655 |
| 3,439,520 | 4/1969 | Schwartz | 72/338 |
| 3,900,053 | 8/1975 | Weresch | 140/105 |
| 4,027,054 | 5/1977 | Porod | 198/654 X |
| 4,077,439 | 3/1978 | Hamuro et al. | 140/105 X |

FOREIGN PATENT DOCUMENTS

1094914 5/1955 France .
753518 7/1956 United Kingdom .

*Primary Examiner*—Kenneth J. Ramsey
*Attorney, Agent, or Firm*—Fetherstonhaugh & Co.

[57] ABSTRACT

A machine for use in the shaping of the leads of electronic components is described herein which includes a work transporter in the form of a belt or a wheel or the like which has a plurality of pockets formed in it which are proportioned to receive the body portion of the component. The transporter is resiliently deformable in an area of the pockets and the pockets are proportioned to receive and apply a retaining force to the main body portion of the component to prevent movement of the component relative to the transporter. At least one lead forming mechanism is operable in the work path for forming the leads to a predetermined configuration.

6 Claims, 9 Drawing Figures

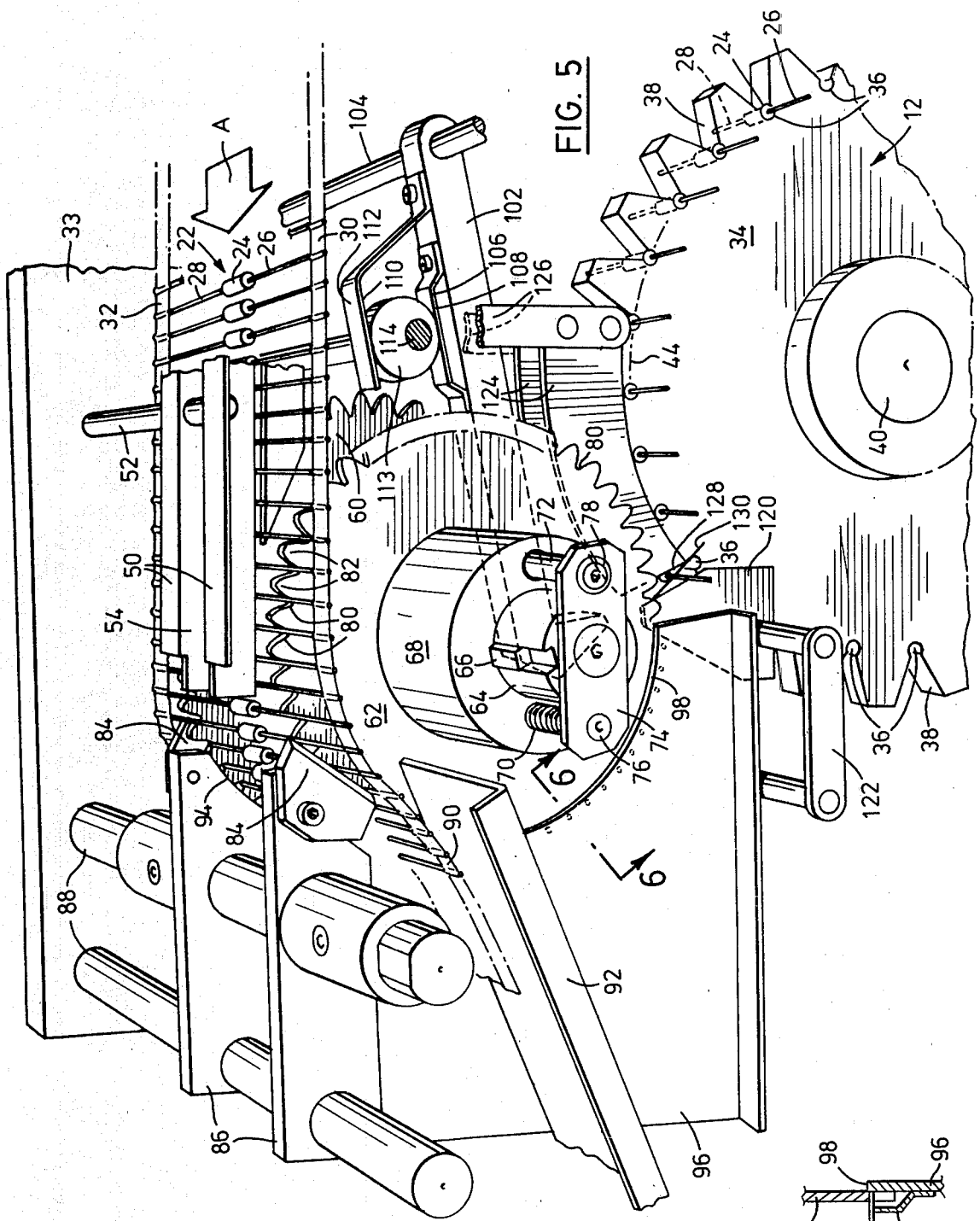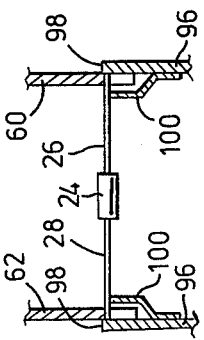

MACHINE FOR FORMING THE LEADS OF ELECTRONIC COMPONENTS

This invention relates to a machine for forming the leads of electronic components to a predetermined configuration.

Electronic components such as resistors, capacitors, transistors, diodes and the like each comprise a body having leads extending from at least one end thereof. Generally it is necessary to perform at least one bending operation on each lead and in many applications it is necessary to perform two bending operations on each lead. Considerable difficulty has been experienced in forming the required bends in the leads in the required position with respect to the body and in the forming of one bend in a predetermined position relative to another bend in the same or in the other lead. Difficulty has also been experienced in forming a bend closely adjacent the main body of the component. In addition, considerable difficulty has been experienced in attempting to form the bends without damage to the integrity of the main body of the component.

In known machines for use in the forming of the leads of an electronic component it is customary to support the leads adjacent the area in which a bend is to be formed and to bend the leads about the support. When a bend is to be formed in each of two leads, it is customary to simultaneously bend the leads to obtain the two bends in an attempt to accurately locate the bend of one lead with respect to the bend of the other lead. Thus, both leads are held while the bending operations are being performed. It has been found that by holding both leads while the two bending operations are performed, considerable stress may be applied to the main body of the component and this stress can destroy the integrity of the main body, thereby rendering the component defective.

I have found that many of the difficulties of the previous machines can be overcome by providing a work transporter for use in transporting the components through the various bending operations which is designed to engage the body portion of the components for the purposes of supporting the components during the lead forming operations. By reason of the fact that the main body portions of the components are generally substantially larger than the lead wires, a greater support area is available for engagement by the work transporter unless it is possible to firmly hold the body while forming the leads to the required configuration. By proportioning the pockets which house the main body to firmly hold the main body in a fixed position relative to the transporter, it is possible to transport the components from one forming station to another forming station without any relative movement occurring between the component and the transporter and thus it is possible to accurately position the bend formed in a second forming operation with respect to the bend formed in the first forming operation.

By reason of the fact that the main body portion is retained in the transporter during the bending operation, it is possible to bend the leads closely adjacent the main body portion, thereby minimizing the overall proportions of the component.

When there is a danger of excessively straining the main body component during the bending operation, the bends which are to be formed in one lead may be formed in a first forming operation with the bends which are to be formed in the second lead being formed in a subsequent forming operation with the result that only one lead is being worked upon at any one time. Thus, the only loads which are being applied to the main body are those applied at one end and that applied to retain the body in the mounting pockets of the transporter.

According to one aspect of the present invention there is provided a machine for use in the shaping of the leads of electronic components of the type having a main body portion and leads projecting therefrom, said machine comprising, a work transporter mounted for movement along a work path which extends through a lead forming station, a plurality of pockets formed in said transporter and opening outwardly therefrom at spaced intervals along the length thereof, said transporter being resiliently deformable in the area of said pockets and said pockets being proportioned to receive and apply a retaining force to the main body portion of a component located therein in use to prevent movement of the component relative to the transporter, and at least one lead forming means operable in said work path for forming the leads to a predetermined configuration, said transporter being in the form of a resilient plastic wheel, each of said pockets formed at the peripheral edge of the wheel and having an input passage opening radially therefrom and a lead outlet passage opening laterally therefrom at one side of the wheel.

The invention will be more clearly understood after reference to the following detailed specification read in conjunction with the drawings, wherein FIG. 1 is a partially sectioned side view of a machine constructed in accordance with an embodiment of the present invention;

FIG. 5 is a partially sectioned pictorial view of a machine of FIG. 1;

FIG. 6 is a sectional view taken along the line 6—6 of FIG. 5;

Figure 1:
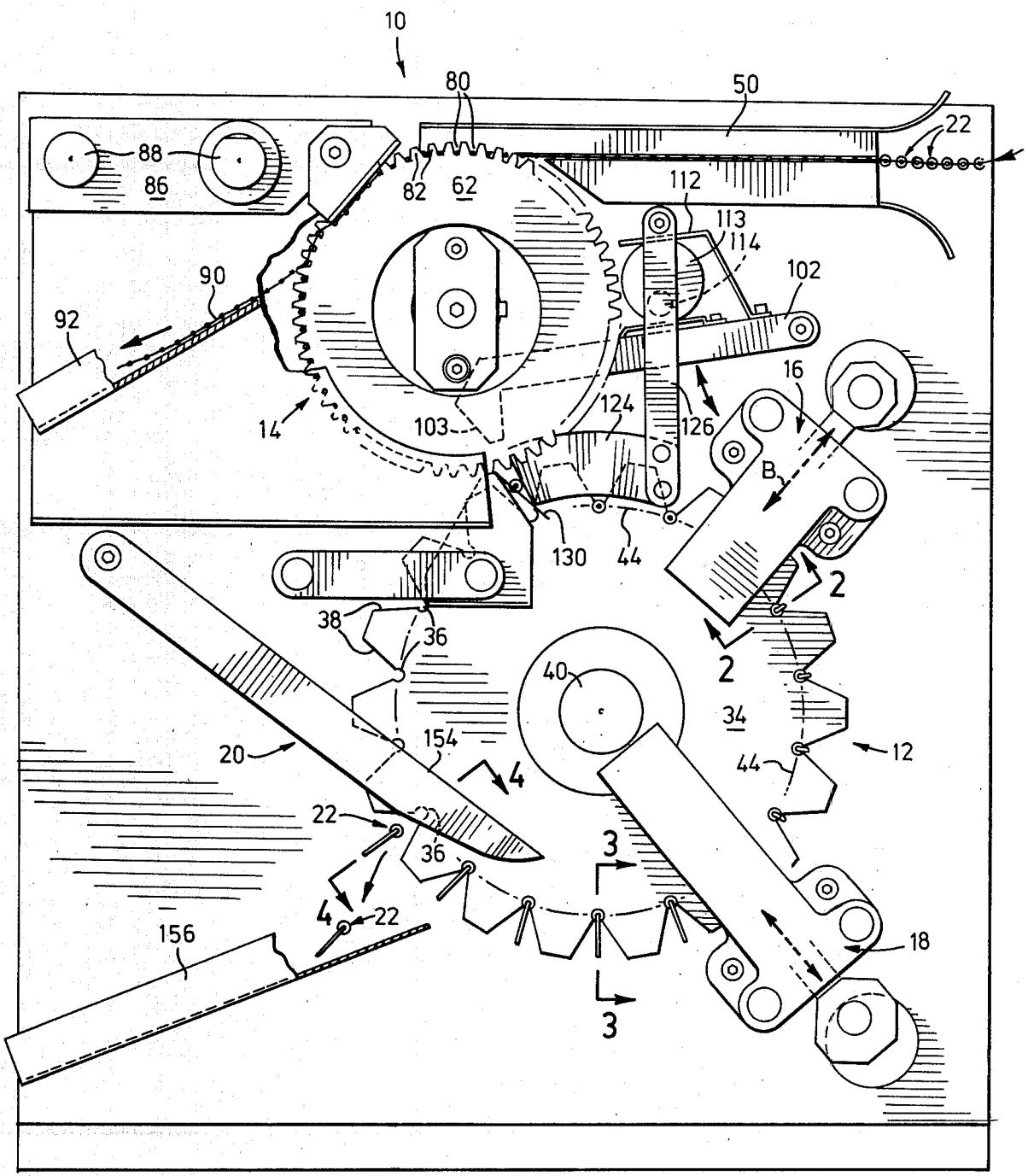

With reference to FIG. 1 of the drawings, the reference numeral 10 refers generally to a machine constructed in accordance with an embodiment of the present invention. In this embodiment the machine has a work transporter generally identified by the reference numeral 12, a loading mechanism generally identified by the reference numeral 14, a first former generally identified by the reference numeral 16, a second former generally identified by the reference numeral 18 and a discharge device generally identified by the reference numeral 20.

I will be understood that although a loading mechanism such as that identified by the reference numeral 14 and a discharge mechanism such as that identified by the reference numeral 20 are desirable in the preferred embodiment illustrated, the loading and discharge of the components may be effected manually.

The components which are to be formed may be any one of a number of electronic components such as those generally identified by the reference numeral 22 which consist of a main body portion 24 having a lead 26 projecting from one end thereof and a lead 28 projecting from the other end thereof. The leads 26 and 28 are secured by binding tapes 30 and 32 in a spaced parallel relationship.

The transporter 12 is in the form of a wheel 34 which is made from resilient plastic material such as moulded polyurethane or polyethylene or the like. The wheel 34 is formed with a plurality of pockets 36 at uniformly spaced intervals about the periphery thereof. The pockets 36 have a V-shaped entrance 38 opening outwardly therefrom through the outer peripheral edge of the wheel. The pockets 36 are open at each side face of the wheel. The pockets 36 are proportioned so as to be slightly smaller than the main body 24 of the component so that when the main body 24 of the component is located therein, it will be held fast with respect to the transporter and will not move when the bending operations are being performed on the leads and during transportation of the component along the work path.

The wheel 34 is mounted for rotation on a shaft 40 to cause the pockets 36 to travel around a circular work path 44 which extends through the loading station, the first forming station, the second forming station and the discharge station.

Although loading of the transporter wheel can be performed manually, as previously described, the loading mechanism illustrated in the present application has several features which make it particularly suitable for use with the work transporter described above.

The loader mechanism includes a pair of guide rails 50 which are mounted on a support arm 52 which is in turn supported by the frame 33. The guide rails 50 define a channel 54 therebetween which has a width substantially equal to the length of the main body portion 24 of the components. The guide rails 50 are positioned to align the guide channel 54 with the work path of the transporter wheel 34. This ensures that the main body portions 24 of the components are transported along a feed path which is aligned with the work path of the transporter wheel 34.

Transfer cutter wheel 60 and 62 are mounted on a shaft 64 and are keyed thereto by means of a key 66. The wheels 60 and 62 are arranged in a spaced parallel relationship and are independently axially adjustable with respect to the shaft 64. The wheel 62 has a boss 68 which has a threaded passage 70 opening inwardly thereof and an unthreaded through passage 72 extending therethrough. A header plate 74 is fixed to the outer end of the shaft 64. Adjustment screws 76 and 78 are mounted in the header plate 74. The adjustment screw 76 is threadably mounted in the threaded passage 70 of the boss 68 and the adjustment screw 78 extends through the clearance passage 72 of the boss and is threadably mounted in a boss formed on the wheel 60. Preferably the adjustment screw 76 has an unthreaded outer end projecting through an unthreaded passage in the boss formed in the second wheel 60. Thus, adjustment of the adjustment screw 70 serves to move the wheel 62 axially with respect to the shaft 64 independently of the wheel 60. Similarly, adjustment of the adjustment screw 78 affects axial adjustment of the wheel 60 relative to the shaft 64. This independent adjustment is of particular importance when the length of the lead projecting from one side of the main body portion is to be longer than that projecting from the other side thereof. The transfer cutting wheels 60 and 62 each have notches 80 formed between adjacent cutting teeth 82. Cutter blades 84 are disposed in an outwardly overlying relationship with respect to the wheels 60 and 62 with their cutting edge positioned to cooperate with the notches 80 to shear the ends of the leads which project laterally outwardly therefrom. The blades 84 are mounted on support brackets 84 which are in turn mounted for axial movement along support shafts 88 which are mounted on the frame 33.

The selvedge portions 90 of the leads are discharged along a waste chute 92.

After the selvedge is severed from opposite ends of the leads, the components are retained against radial movement out of the notches 80 by means of the arcuate face 94 of the support plates 86 and are retained against axial movement by the inner faces of the cutter blades 84. The components are subsequently supported for movement along the required feed path by retaining plates 96 (FIGS. 5 and 6) which are arranged in a spaced parallel relationship. Each retainer plate 96 has an outer edge 98 which extends parallel to and radially inwardly from the base of the notches 80 of the wheels 60 and 62 over an arc extending continuously from the cutting station to the loading station to prevent axial movement of the components during transportion from the cutting station to the loading station. Similarly, ledges 100 are mounted on the retainer plates 96 and projecting inwardly therefrom to form a shoulder which extends continuously along the retainer plates 96 from the cutting station to the loading station to prevent radial movement of the components relative to the transfer wheels.

In the loading station a rocker arm 102 has one end pivotably mounted on a support shaft 104 which is supported by the frame 33. The other end of the rocker arm 102 is formed with a V-shaped head 103 proportioned to fit freely within the V-shaped entrance 38 to the pockets 36 of the transporter wheel 34. A spring plate 106 has one end secured with respect to the rocker arm 102 and has a central body portion 108 spaced from the rocker arm 102. A similar spring plate 110 has one end secured to the rocker arm 102 and a central body portion 112 disposed above the body portion 108 of the spring 106. A cam 113 is eccentrically mounted on a shaft 114 between the central body portions 108 and 112 of the spring plates 106 and 110. Rotation of the cam 113 with the shaft 114 causes the rocker arm 102 to pivot about the shaft 104 to move the head 103 between the raised position shown in FIG. 7 and the lowered position shown in FIG. 8. The resilience of the spring plates 106 and 110 ensure that the rocker arm is yieldable so that it will not force a component into a pocket of the transporter wheel when the component is not correctly aligned with respect to the pocket of the transporter wheel in use.

In the loading station, a pair of guide plates 120 are located one on either side of the transporter wheel 34 and are supported by a support frame structure generally identified by the reference numeral 122. A further pair of support plates 124 are supported one on either side of the transporter wheel 34 by a support frame structure 126. A gap 128 is formed between oppositely disposed edges of the guide plates 120 and 124. The gap 128 forms a slipway extending between the feeding path of the loader mechanism and the work path 44 of the transporter wheel. A spring 130 is mounted on each guide plate 120 adjacent the upper end thereof and extends downwardly and across the slipway 128. The springs 130 serve to form a barrier in each slipway 128 which limits the free fall of the component during the transfer of the component from the transfer cutting wheel to the work wheel.

Figure 7:
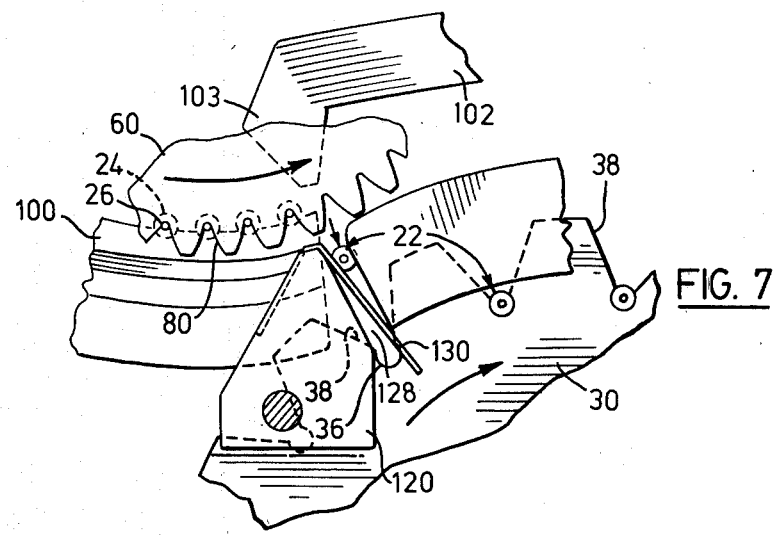
FIG. 7 is an enlarged detail view of the loading station of the machine.
Figure 8:
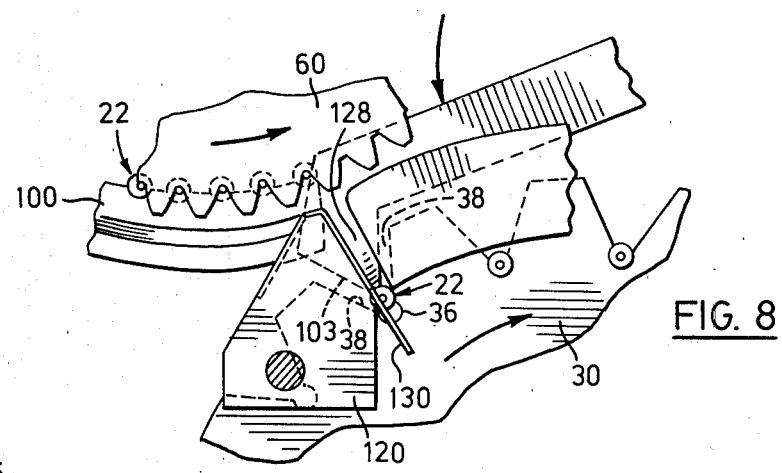
FIG. 8 is a view similar to FIG. 7 showing the pusher arm in a lowered position.

In use, belted components are fed to the loading mechanism in the direction of the arrow A. The main body portions 24 are aligned in the channel 54 so as to assume the correct lateral position with respect to the feed path prior to entry into the cutting station. The transfer cutting wheels are indexed to advance the components along the feed path into the cutting station to cut the leads to required lengths with the selvedges 90 being discharged along waste chutes 92. The components are indexed along the feed path until they arrive at the loading station. As shown in FIG. 7 of the drawings, the transfer cutting wheels and the transporter wheel are simultaneously indexed to align a pocket 36 of the transporter wheel and a notch 80 of the transfer wheel with the slipway 128. Thus, a component 22 is discharged from the transfer wheels into the slipway 128 and is retained adjacent the upper end of the slipway 128 by means of the spring 130. The springs 130 serve to limit the free-fall of the component, thereby reducing the likelihood of the component becoming misaligned during free-fall into the slipway 128. Thereafter the cam 113 is rotatably driven to drive the head 103 of the rocker arm downwardly into engagement with the component. Continued movement of the head 103 forces the component to deflect the springs 130 and move downwardly within the slipway 128 into the pockets 36. As previously indicated, the body of the transporter wheel is made from resilient materials so that it will yield in the area of the entrance to the pockets to permit the body portion 24 of the component to be housed within the pocket 36. Further rotation of the cam 113 returns the rocker arm to the position in which the head 103 is withdrawn to the position illustrated in FIG. 7.

Figure 2:
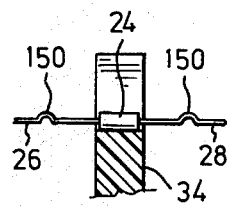
FIG. 2 is a sectional view taken along the line 2—2 of FIG. 1.
Figure 3:
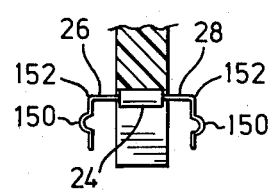
FIG. 3 is a sectional view taken along the line 3—3 of FIG. 1.
Figure 4:
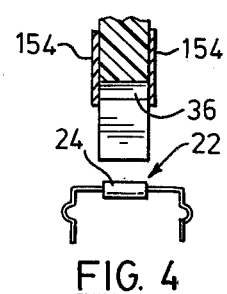
FIG. 4 is a sectional view taken along the line 4—4 of FIG. 1.

After withdrawal of the head 103, the transporter wheel 34 is indexed to advance the components carried thereby along the work path 34. As previously indicated, the worth path 44 extends through a first forming device 16 which is mounted for radial movement in the direction of the arrow B to form dimples 150 in the leads 26 and 28 (FIG. 2). Subsequent indexing of the transporter wheel 34 transports the component to the second forming head 18 which is mounted to movement relative to the transporter wheel 36 to form a second bend 152 in the leads 26 and 28 (FIG. 3). Thereafter, further indexing of the transporter wheel transports the components along the work path 44 into engagement with plow blades 154 of the discharge mechanism 20. The plow blades 154 are disposed one on each side of the transport wheel 34 and serve to dislodge the main body portion 24 from the pocket 26 of the wheel as shown in FIG. 4 of the drawings. The components 22 fall into a discharge chute 156.

Various modifications of the preferred embodiment described above will be apparent to those skilled in the art. For example, by reason of the fact that the component body 24 is supported in the transporter wheel during the lead forming operations, the bends such as those illustrated at 152 in FIG. 3 may be formed very close to the ends of the main body portion 24. Furthermore, one of the leads may be bent upon itself to as to project parallel to the main body portion and beyond the opposite end of the main body portion in close proximity to the main body portion so that the leads extend radially. In addition, bending of the lead 126 may be carried out independently of the bending of the lead 28. The fact that the transporter wheel will retain the body against movement relative thereto is sufficient to permit independent forming of the leads.

Figure 9:
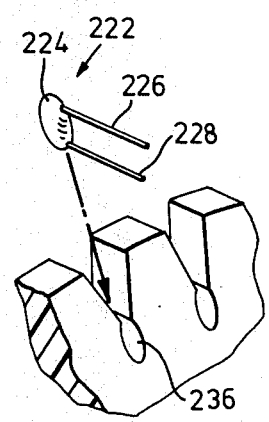
FIG. 9 is a detail view of a portion of a transporter having pockets shaped to accommodate a component having a different configuration to that previously illustrated.

In FIG. 9 of the drawings, pockets 236 are shaped and proportioned to receive the main body portion 224 of a component 222 with the leads 226 projecting from one side of the body 224.

From the foregoing it will be apparent that the use of a work transporter which is resilient in the area of the mounting pockets which are formed therein permits the components to be supported by the main body portions thereof during the forming of the leads to the required configuration and this in turn permits the leads to be formed to the required configuration without an excessive load being applied to the main body during forming. Furthermore, by reason of the fact that the components are supported by the main body portion, it is possible to support the components so that it is held fast furing two or more forming operations so that the bends formed in each forming operation are accurately position with respect to one another. These and other advantages of the apparatus of the present invention will be apparent to those skilled in the art.

It will be understood that the components need not be taped for feeding to the machine but may be carded or fed by a bulk feeder of a conventional construction.

The embodiments of the invention in which an exclusive property or privilege is claimed are defined as follows:

1. A machine for use in the shaping of the leads of electronic components of the type having a main body portion and leads projecting therefrom, said machine comprising,
    (a) a work transporter mounted for movement along a work path which extends through a lead forming station,
    (b) a plurality of pockets formed in said transporter and opening outwardly therefrom at spaced intervals along the length thereof, said transporter being resiliently deformable in the area of said pockets and said pockets being proportioned to receive and apply a retaining force to the main body portion of a component located therein in use to prevent movement of the component relative to the transporter,
    (c) at least one lead forming means operable in said work path for forming the leads to a predetermined configuration,
    and
    (d) said transporter being in the form of a resilient plastic wheel, each of said pockets being formed at the peripheral edge of the wheel and having an input passage opening radially therefrom and a lead outlet passage opening laterally therefrom at one side of the wheel.

2. A machine as claimed in claim 1 wherein each of said pockets has a lead outlet passage opening laterally at both sides of the transporter wheel.

3. A machine as claimed in claim 1 or 2 wherein an entranceway extends between each input passage and its associated pocket, the entranceway being proportioned to be smaller than the body portion whereby it must be resiliently deformed to permit the body of the component to pass therethrough into and out of its associated pocket.

4. A machine for use in the forming of the leads of electronic components to a predetermined shape, the components being of a type having a main body portion and leads projecting therefrom, said machine comprising,
   (a) a work transporter mounted for movement along a work path which extends through a loading station, a work forming station and a discharge station,
   (b) a plurality of pockets formed in said transporter at spaced intervals along the length thereof, said transporter being resiliently deformable in the area of said pockets and said pockets being proportioned to receive and apply a retaining force to the main body resisting movement of the main body relative to the transporter,
   (c) loading means in said loading station for loading the body portion of components into said pockets,
   (d) at least one lead forming means in said forming station operable to form the leads to a predetermined configuration,
   (e) discharge means in said discharge station operable for removing components from said pockets, and
   (f) said transporter being in the form of a resilient plastic wheel, each of said pockets being formed at the peripheral edge of the wheel and having an input passage opening radially therefrom and a lead outlet passage opening laterally therefrom at one side of the wheel.

5. A machine as claimed in claim 4 wherein each of said pockets has a lead outlet pocket opening laterally at both sides of the transporter wheel.

6. A machine as claimed in claim 4 or 5 wherein an entranceway extends between each input passage and its associated pocket, the entranceway being proportioned to be smaller than the body portion whereby it must be resiliently deformed to permit the body of the component to pass therethrough into and out of its associated pocket.

* * * * *